(12) United States Patent
Ramm et al.

(10) Patent No.: US 11,479,862 B2
(45) Date of Patent: Oct. 25, 2022

(54) CORROSION- AND EROSION-RESISTANT COATING FOR TURBINE BLADES OF GAS TURBINES

(71) Applicant: Oerlikon Surface Solutions AG, Pfäffikon, Pfäffikon (CH)

(72) Inventors: Juergen Ramm, Maienfeld (CH); Hamid Bolvardi, Chur (CH); Oliver Jarry, Cologne (DE); Lin Shang, Bad Ragaz (CH); Beno Widrig, Bad Ragaz (CH); Carmen Jerg, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 39 days.

(21) Appl. No.: 16/956,978

(22) PCT Filed: Dec. 20, 2018

(86) PCT No.: PCT/EP2018/086371
§ 371 (c)(1),
(2) Date: Jun. 22, 2020

(87) PCT Pub. No.: WO2019/122229
PCT Pub. Date: Jun. 27, 2019

(65) Prior Publication Data
US 2020/0392629 A1    Dec. 17, 2020

Related U.S. Application Data

(60) Provisional application No. 62/609,650, filed on Dec. 22, 2017.

(51) Int. Cl.
*C23C 14/06* (2006.01)
*C23C 28/04* (2006.01)
*C23C 28/00* (2006.01)

(52) U.S. Cl.
CPC ........ *C23C 28/042* (2013.01); *C23C 14/0676* (2013.01); *C23C 28/321* (2013.01); *C23C 28/345* (2013.01)

(58) Field of Classification Search
CPC .................... C23C 14/0676; C23C 28/345
(Continued)

(56) References Cited

U.S. PATENT DOCUMENTS

2004/0137281 A1* 7/2004 Ishikawa ............. C23C 14/0676
428/702
2008/0193782 A1* 8/2008 Ramm .................. C23C 14/024
428/469
(Continued)

FOREIGN PATENT DOCUMENTS

| CN | 102011093 A | 4/2011 |
| CN | 103483009 A | 1/2014 |
| WO | 2014170005 A2 | 10/2014 |

OTHER PUBLICATIONS

M. Stuber, et al., "Magnetron Sputtering of Hard Cr—Al—N—O Thin Films," Surface and Coatings Technology, May 1, 2008, pp. 661-665, vol. 203, Elsevier B.V.
(Continued)

*Primary Examiner* — Archene A Turner

(57) ABSTRACT

A component of a turbine, in particular a gas turbine, wherein the component has a coating for increasing the erosion and corrosion resistance, wherein the coating is preferably applied directly to the component, wherein the coating consists of a functional layer and an intermediate layer, wherein the intermediate layer is arranged between the turbine blade substrate and the functional layer and wherein the functional layer consists of the elements Al, Cr, O and N.

11 Claims, 7 Drawing Sheets

(58) Field of Classification Search
USPC .......................................................... 428/697
See application file for complete search history.

(56) References Cited

U.S. PATENT DOCUMENTS

| | | | | |
|---|---|---|---|---|
| 2009/0252973 | A1* | 10/2009 | Cremer | C23C 28/042 |
| | | | | 428/446 |
| 2011/0195261 | A1* | 8/2011 | Kurapov | C23C 28/042 |
| | | | | 428/472 |
| 2016/0060746 | A1* | 3/2016 | Ramm | C23C 14/081 |
| | | | | 428/216 |
| 2016/0273093 | A1* | 9/2016 | Ramm | C23C 14/5826 |
| 2017/0217838 | A1* | 8/2017 | Harada | C04B 35/64 |

OTHER PUBLICATIONS

O. Knotek, et al., "Diffusion Barrier Coatings with Active Bonding, Designed for Gas Turbine Blades," Surface and Coatings Technology, 1994, pp. 22-26, vol. 68/69, Elsevier B.V.

M. Hirai et al., "Oxidation Behavior of Cr—Al—N—O Thin Films Prepared by Pulsed Laser Deposition," Thin Solid Films, 2002, pp. 122-125, vol. 407, Elsevier B.V.

M. Stueber et al., "Synthesis of Cr—Al—O—N Thin Films in Corundum and F.C.C. Structure by Reactive R.F. Magnetron Sputtering," Thin Solid Films, 2002, pp. 4025-4031, vol. 519, Elsevier B.V.

* cited by examiner

Figure 10

| Element | Wt % | At % |
|---|---|---|
| N K | 19.38 | 32.71 |
| O K | 15.99 | 23.62 |
| Al K | 33.87 | 29.68 |
| Cr K | 30.76 | 13.98 |
| Total | 100.00 | 100.00 |

CORROSION- AND EROSION-RESISTANT COATING FOR TURBINE BLADES OF GAS TURBINES

The present invention relates to blades for gas turbines with a coating having improved erosion and corrosion resistance and to other components of gas turbines with such a coating.

TECHNICAL BACKGROUND

Components of gas turbines are exposed to a corrosive medium. It is known to apply coatings to protect these components from corrosion. Among other things, physical coatings that have been deposited from the gas phase are used here.

According to conventional prior art, TiN/Ti, TiN/TiAlN and TiAlN layer systems are used. These show improved erosion resistance, but inadequate corrosion resistance, for example, in applications on high-chromium steel substrates.

DE102015212588 represents a further development. It describes a coating system for a corrosively stressed substrate with a surface comprising at least a first, second and third layer, in which the first layer arranged between the surface of the substrate and the second layer is designed as an adhesion promoting layer, the second layer is a ductile metallic layer with a columnar structure, and the third layer arranged on the side of the second layer facing away from the substrate is a ceramic oxide layer with a hardness of at least 20 GPa.

The hardness specified in the unit GPa relates to the pressure that the coating can oppose to the penetration of an object.

The formation of the first layer according to the prior art as an adhesion promoting layer ensures greater adhesion between the base material and the second layer of the coating system.

The second layer protects the substrate cathodically by its function as a sacrificial anode. The ductility of the second layer serves to absorb strains under vibrating stress without cracks occurring in the layer. The columnar structure of the second layer serves to compensate for residual stresses caused by the third layer.

The third layer of the coating system preferably has aluminum oxide and/or chromium oxide and/or an aluminum chromium oxide in a mixed crystal structure. It can also consist entirely of these oxides. Due to the oxides, the third layer is resistant to oxidation, since it already consists of at least one oxide and can therefore be used at high temperatures. The third layer has a very dense structure. The third layer acts among other things as corrosion protection for the second layer. Furthermore, due to its ceramic nature, the third layer has an insulating effect, which advantageously prevents galvanic effects. Furthermore, the third layer is significantly harder than the base material and therefore has an advantageous effect on the layers underneath and the base material as protection against erosion, particularly against droplet impact and particle erosion. The hardness of the third layer is preferably approximately 25 GPa.

A method for producing a coating system for a corrosively stressed substrate is also known, which comprises three layers corresponding to the coating system according to the invention, the material of all layers being applied by physical vapor deposition (PVD). The method is advantageous because heat treatment is not required. Furthermore, layers applied by PVD have an advantageous surface roughness, which ensures good aerodynamic properties.

According to the prior art, the PVD layers of the coating system are applied by cathodic spark evaporation and/or by sputtering.

A disadvantage of the layer system comprising 3 layers according to the prior art, however, is the fact that the third, very hard oxide layer has too little elasticity to remain undamaged in the case of particle impact. As a result, it can locally lose its effect as a protective layer for the second layer.

THE OBJECTIVE OF THE INVENTION

The objective of the present invention is therefore to specify a coating system for components of gas turbines, which coating system has improved erosion and corrosion resistance.

THE SOLUTION ACCORDING TO THE INVENTION

According to the invention the objective is achieved by a component according to claim 1. The component according to the invention has an erosion and corrosion resistant coating with a functional layer and an intermediate layer which is arranged between the turbine blade substrate and the functional layer.

Specifically, it can be said that the invention provides a component and preferably turbine blade of a turbine, in particular of a gas turbine, which has a coating to increase the erosion and corrosion resistance, as described below.

The coating according to the invention is preferably applied directly to the component. It is characterized by the fact that it consists of a functional layer and an intermediate layer. The intermediate layer is arranged between the turbine blade substrate and the functional layer. The functional layer essentially consists of the elements Al, Cr, O and N, which must all be represented. The functional layer preferably consists only of these elements. Within the scope of a broader aspect of the invention, one or more further elements can be present, but only in such type and such amounts that they do not influence or do not negatively influence the corrosion resistance and the erosion resistance.

The present invention allows in particular to extend the service life of turbine blades in gas turbines by reducing their wear and, at the same time, increasing the times between necessary service intervals.

According to the invention, the erosion resistance of the base material to the impact of solid particles, droplets and also to blistering is increased.

The functional layer contains face-centered cubic (Fm-3m) CrN and AlN. This leads to a high layer hardness with an improved modulus of elasticity. The solution according to the invention is therefore superior to the brittle third layer that DE 10 2015 212 588 has previously proposed as an external layer. As will be explained in more detail later, the invention is also based on the knowledge that a functional layer in the form of a pure Al—Cr—N layer does not show good corrosion resistance in the salt spray test. Only the addition of oxygen in the synthesis of Al—Cr—O—N increases the corrosion resistance, which constitutes the ultimate strength of the invention.

For the purpose of increasing the corrosion resistance, an intermediate layer can be applied between the substrate and the functional layer, which intermediate layer is adapted both to the specific substrate material, for example the Cr content of the steel, and to the special corrosive environment against which protection is to be achieved, for example against chlorine or sulfur.

PREFERRED DEVELOPING POSSIBILITIES

There are the following optional possibilities for further refining the invention:

The intermediate layer can comprise a layer system made of Cr and/or AlCr and/or Al—Cr—O, the Cr layers, if present, each being less than 1 μm thick.

The intermediate layer preferably consists of a layer system made of AlCr and Al—Cr—O.

The functional layer can be a monolayer or a multilayer. A multilayer in the sense of the invention is—clearly preferably—a stack of a plurality of layers lying directly one on top of the other, each of which has the composition required by claim 1 for the functional layer. Only in exceptional cases, in order to avoid attempts to circumvent patent law, it should be said that a multilayer in the sense of the invention can still exist if there is, as an alibi, a layer between several functional layers of the required composition, which layer does not significantly impair functionality.

The same definition applies analogously, even where a multilayer is mentioned with respect to the intermediate layer. A multilayer in the sense of the invention is—clearly preferably—a stack of a plurality of layers lying directly one on top of the other, each of which has the composition required by the relevant claim for the intermediate layer.

If the functional layer is a multilayer structure, it is advantageous if in it the Al/Cr ratio and/or the O/N ratio change periodically over at least part of the layer thickness and/or aperiodically over at least part of the layer thickness.

The ratio of Al to Cr (Al/Cr) atoms in the functional layer is particularly preferably between 4 and 1 and even better between 2 and 1.5.

It is further preferred if the ratio of O to N atoms (O/N) in the functional layer is between 0.2 and 1.5, particularly preferably between 0.4 and 1.

It is advantageous, if the functional layer has an indentation hardness (HIT) of at least 25 GPa, preferably greater than 30 GPa, wherein the indentation hardness (HIT) is determined at room temperature by means of a Martens hardness measurement on the Fisherscope H100c in accordance with the IS014577-1 regulations.

The functional layer advantageously has a modulus of elasticity (EIT) of at least 280 GPa, preferably greater than 300 GPa, wherein the modulus of elasticity (EIT) is determined at room temperature by means of a Martens hardness measurement on the Fisherscope H100c in accordance with the IS014577-1 regulations.

The roughness is preferably between 0.1 μm and 0.6 μm with Ra and/or between 1 μm and 8 μm with Rz.

GENERAL INFORMATION ON THE INVENTION

The following then has to be explained with regard to the functioning of the invention:

It is particularly advantageous if, in addition to the cubic (fcc) CrN and cubic (fcc) AlN peaks in X-ray diffraction, the X-ray diffraction spectrum of the functional layer has additional peaks of at least one oxide, as shown in FIG. 1. It is particularly advantageous if the peak originates from a Cr—O and/or from an Al—Cr—O which has a hexagonal structure.

As an explanation, the X-ray diffraction pattern of, for example, synthesized Al—Cr—O—N layers is characterized by the reflections of the face-centered cubic (Fm-3m) CrN (03-065-9001) and face-centered (Fm-3m) cubic AlN (00-025-1495) as shown in FIG. 1. It was found that the existence of these two cubic peaks is important for a high layer hardness and a high value of the modulus of elasticity. These two characteristics determine the high erosion resistance of the layer. However, experiments have also shown that this is not yet sufficient for good corrosion resistance. A pure Al—Cr—N layer does not show good corrosion resistance in the salt spray test. Only the addition of oxygen in the synthesis of Al—Cr—O—N increases the corrosion resistance. In addition to the X-ray diffraction diagram of a pure Al—Cr—N layer, FIG. 1 also shows, as an example, the values for a layer with 12 at. % O (Al—Cr—O—N equal to 100 at. %) and a layer with 24 at. % O. The salt spray corrosion tests on the 12 at. % O layers already showed an improvement in corrosion resistance, but only the addition of 24 at. % O resulted in a layer that had excellent corrosion resistance in the test. Based on the X-ray examinations (FIG. 1), this is probably due to the fact that the oxygen not only accumulates in the nitrides by displacing the nitrogen, but also that oxides are formed, as is the case with X-ray diffraction at the layer with 24 at. % O where $Cr_2O_3$ is formed. Presumably there are also portions of amorphous aluminum oxide which, however, is not visible in X-ray diffraction. In other words, the Al—Cr—O—N layer with high erosion and corrosion resistance should also have the $Cr_2O_3$ phase in addition to the cubic phases of CrN and AlN.

The coating for producing the component according to the invention can be applied by means of PVD processes, preferably with reactive spark evaporation and sputtering.

The component surface to be coated can be a high-chrome steel surface and/or a Ni—Cr, Ni—Co, Ni—Cr—Co-containing substrate surface and/or one or more super alloys preferably containing an aluminide-containing (Al—Ni, Al—Ti, Al—Hf) substrate surface.

PREFERRED EMBODIMENTS

The invention will now be explained in detail on the basis of different embodiments and by means of the figures.

FIG. 1 shows the X-ray spectrum of the functional layer of a layer according to the invention.

FIG. 2 schematically shows the layer structure of a first embodiment A of the present invention with the structure: substrates/Cr/AlCr/AlCrO/Al—Cr—O—N, the outermost layer being a monolayer.

FIG. 3 schematically shows the layer structure of a second embodiment B of the present invention, with the structure: substrates/Cr/AlCr/AlCrO/Al—Cr—O—N, the outermost layer being a multilayer composed of a plurality of individual layers according to the invention, which together form the outer functional layer.

FIG. 4 schematically shows the layer structure of a third embodiment C of the present invention with the structure: substrates/AlCr/AlCrO/Al—Cr—O—N, the outermost layer being a monolayer.

Figure 1:
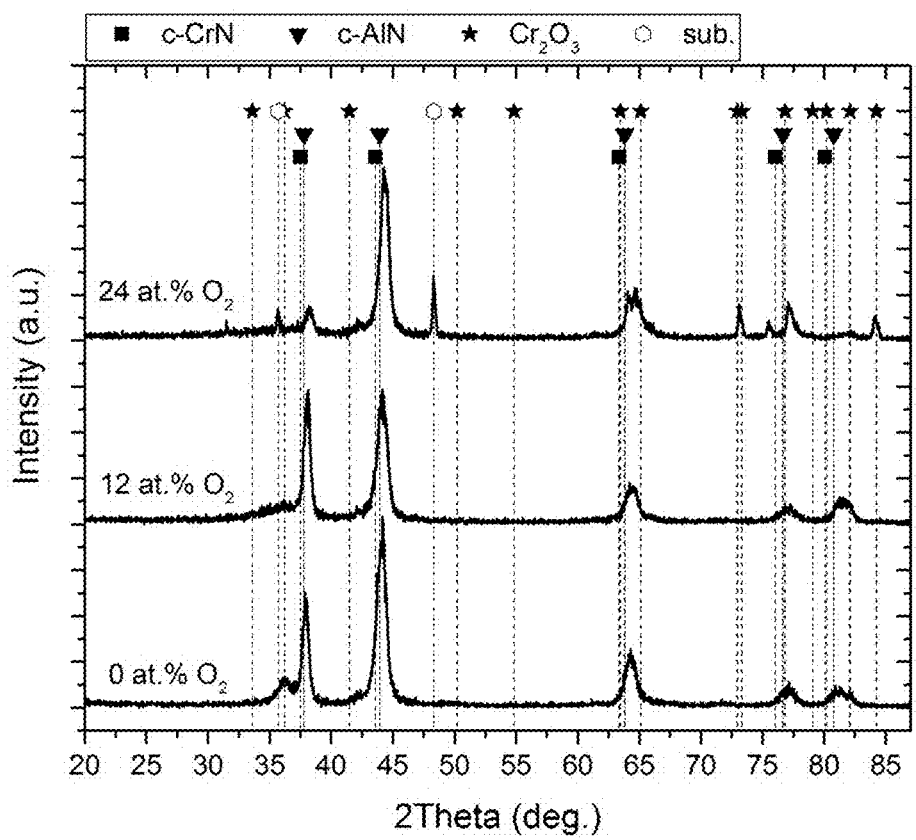
Figure 2:
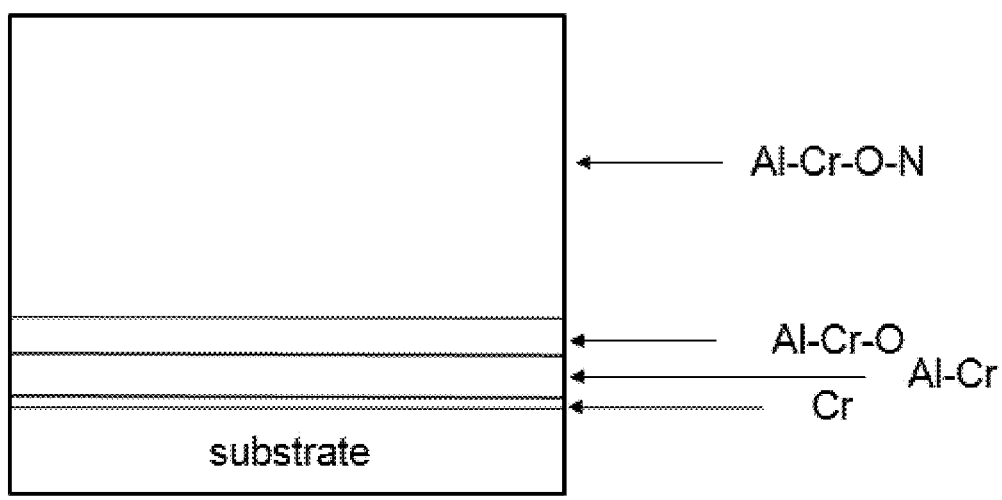
Figure 3:
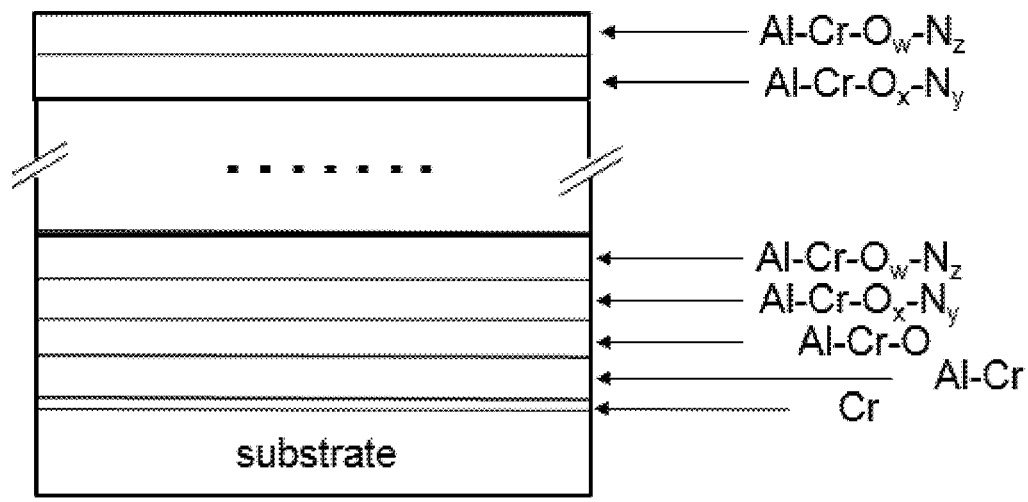
Figure 4:
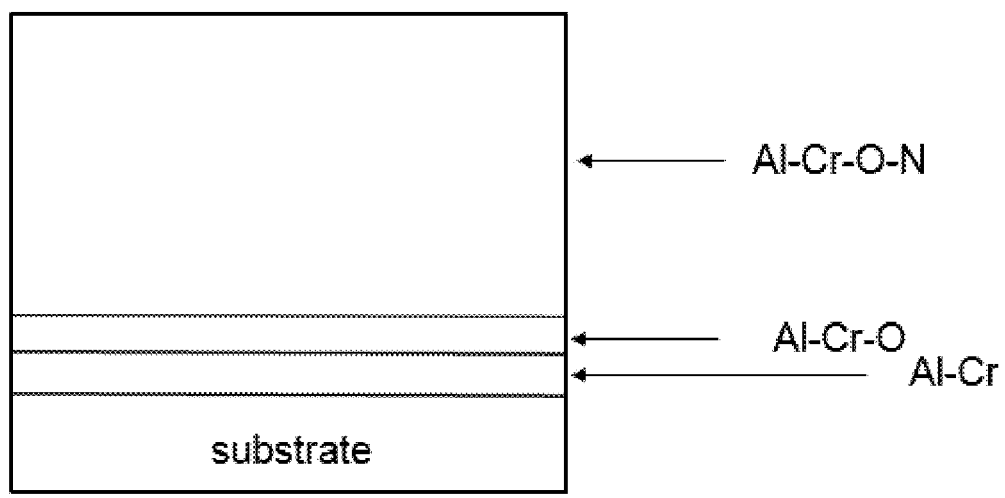
Figure 5:
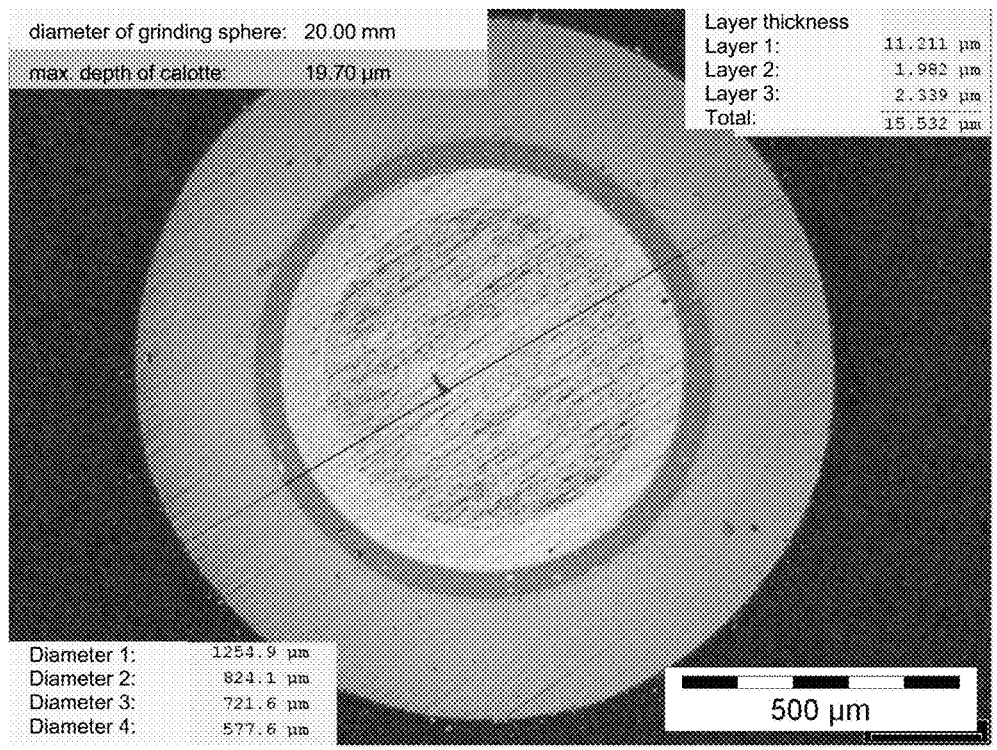
FIG. 5 shows a calotte grinding of a layer system according to the third embodiment.
Figure 6:
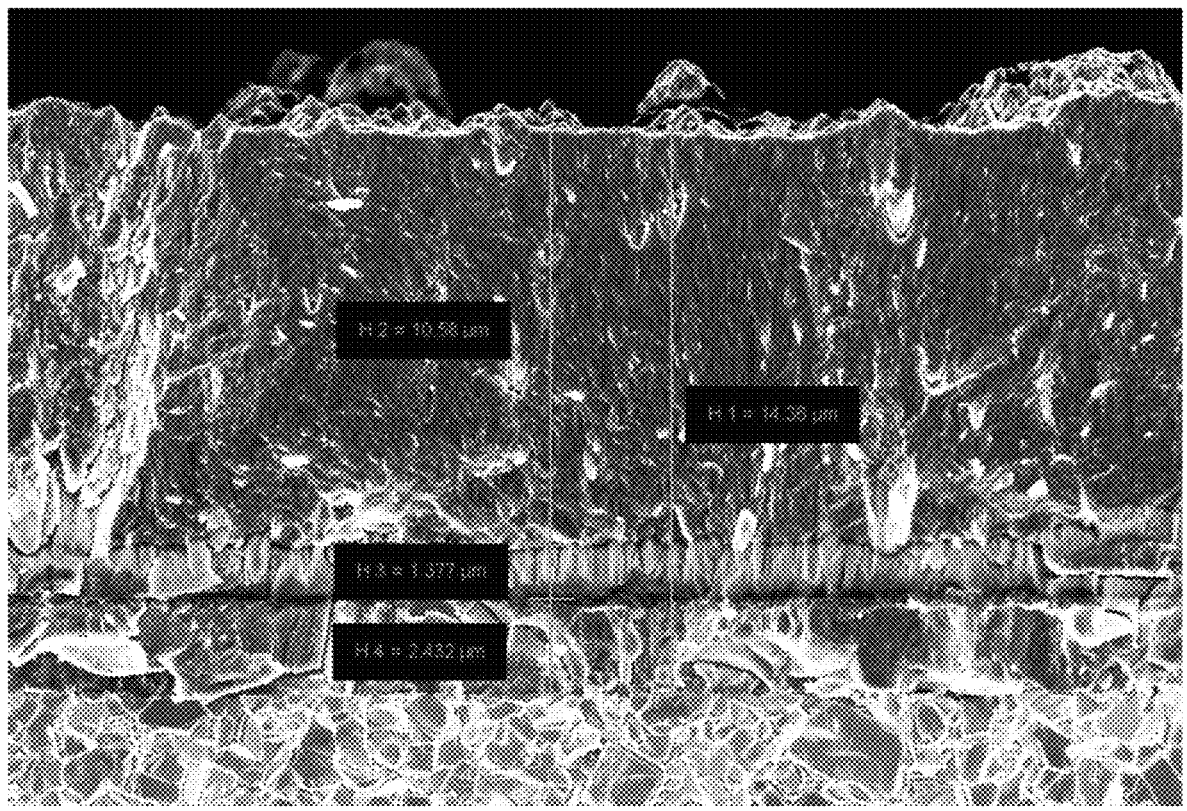
FIG. 6 shows the cross section of a layer system according to the third embodiment in an SEM image.
Figure 7:
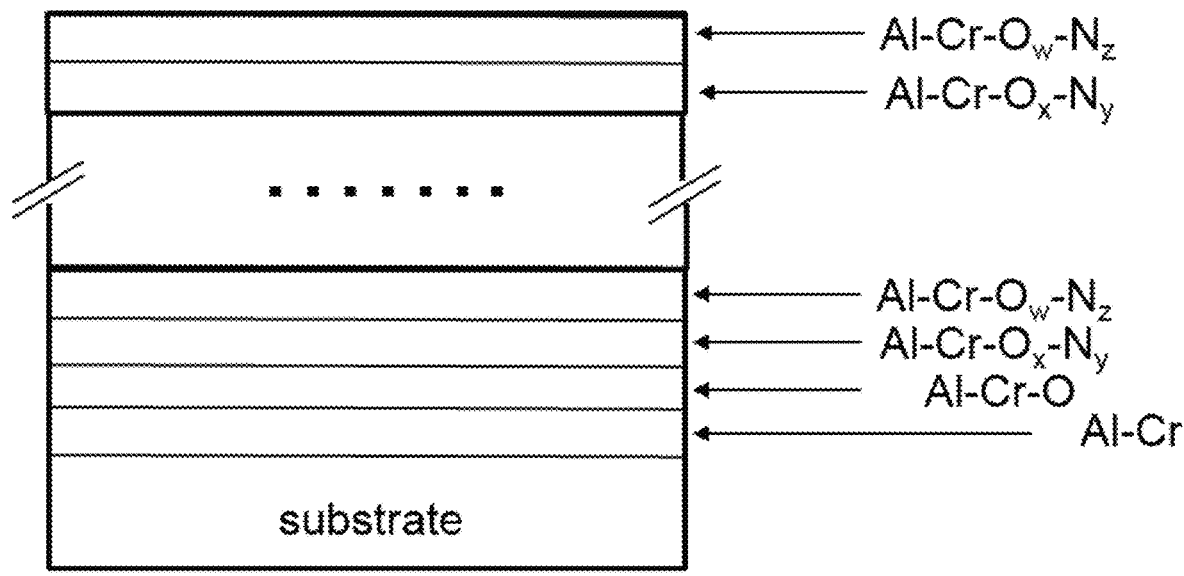

FIG. 7 schematically shows the layer structure of a fourth embodiment D of the present invention with the structure: substrates/AlCr/AlCrO/Al—Cr—O—N, the outermost layer being a multilayer.

Figure 8:
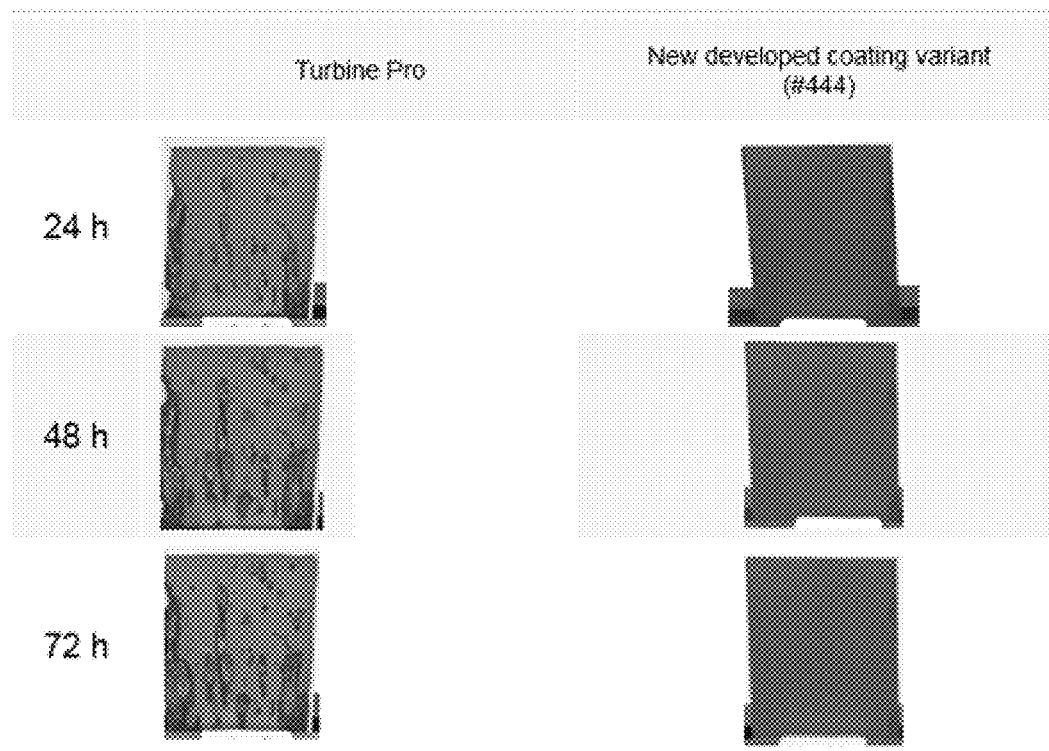

FIG. 8 shows the comparison between a conventional component, referred to as TurbinPro and coated with TiAlN, with embodiment C in the salt spray test. TurbinPro is a commercially available coating product from Oerlikon Surface Solutions AG, Switzerland.

Figure 9A:
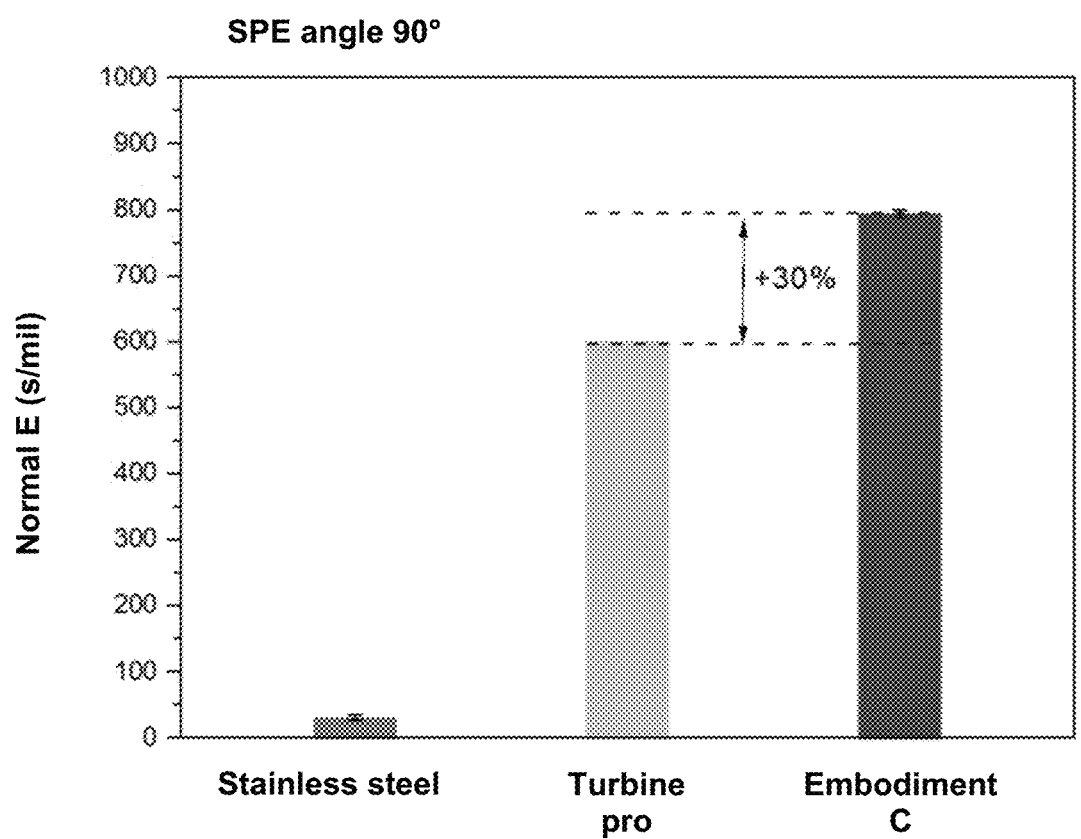

FIG. 9a shows the resistance to solid-state erosion for a particle incidence angle of 90° for different surfaces.

Figure 9B:
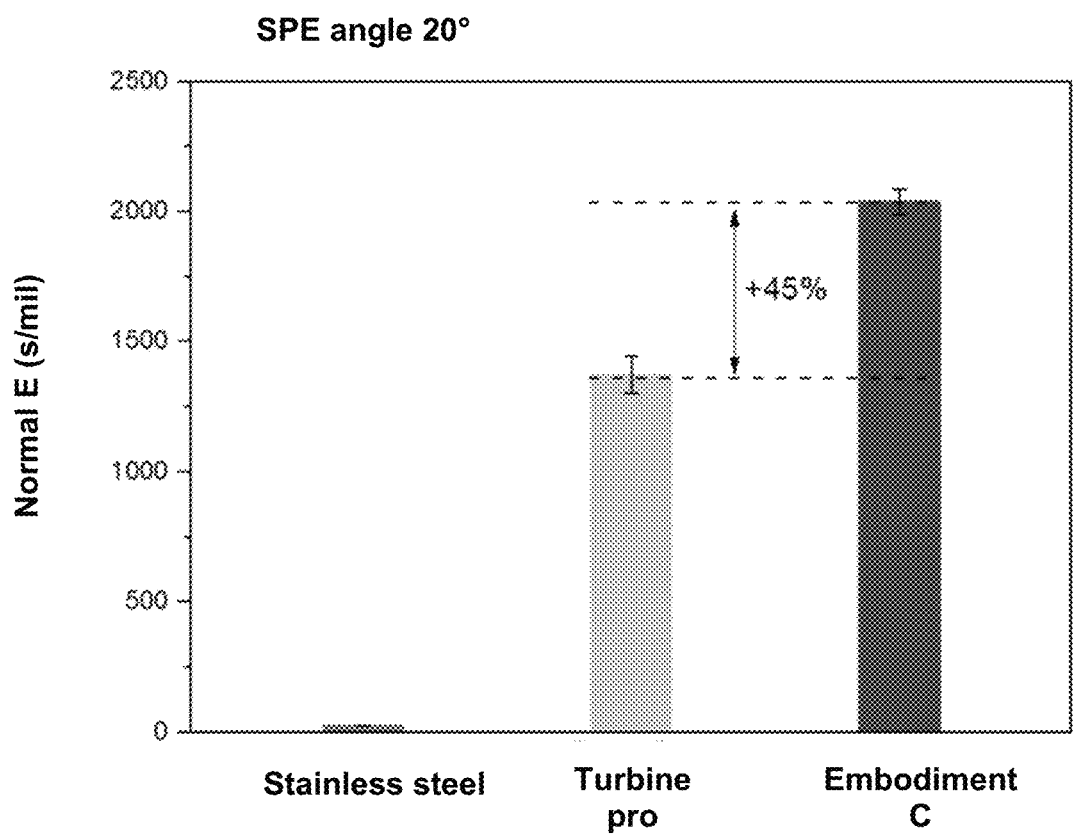

FIG. 9b shows the resistance to solid-state erosion for a particle incidence angle of 20° for different surfaces.

FIG. 10 shows the chemical composition of an example of a layer system according to the invention.

The layer system according to the invention (embodiments A to D) is applied to the component (gas turbine blade) by means of PVD. Variants A and B have an additional Cr-containing layer interface to the substrate, while variants C and D do without this interface. The erosion resistance (solid particle erosion test according to ASTM G76) —and corrosion resistance (e.g. salt spray test according to DIN EN ISO 9227) are optimized via the proportion of oxygen in the Al—Cr—O—N layer. For erosion resistance, the minimum values of layer hardness and modulus of elasticity are decisive, for corrosion protection the minimum oxygen content in the layer is decisive.

MISCELLANEOUS

Basically it should be said that completely independent of the already established claims, but also in combination with it, protection is also claimed for a component that has the characteristics of one of the following paragraphs:

Component of a turbine, in particular a gas turbine, wherein the component can be, for example, a turbine blade and the component has an erosion and corrosion resistant coating, wherein the component is characterized in that the coating is applied to a component substrate and comprises a functional layer and an intermediate layer which is arranged between the turbine blade substrate and the functional layer (paragraph 1).

Component according to the preceding paragraph 1, wherein the component is characterized in that the intermediate layer comprises a layer system made of Cr and/or AlCr and/or Al—Cr—O.

Component according to the immediately preceding paragraph 2, wherein the component is characterized in that the intermediate layer consists of a layer system of AlCr and Al—Cr—O.

Component according to the preceding paragraph 2, wherein the component is characterized in that the functional layer essentially comprises the elements Al, Cr, O and N.

Component according to one of the preceding paragraphs of this chapter, wherein the component is characterized in that the functional layer is a monolayer or a multilayer.

Component according to paragraph 5, wherein the component is characterized in that the functional layer comprises a multilayer structure in which the Al/Cr ratio and/or the O/N ratio change periodically over at least part of the layer thickness and/or aperiodically over at least part of the layer thickness.

Component according to paragraph 5, wherein the component is characterized in that the ratio of Al to Cr (Al/Cr) atoms in the functional layer is between 4 and 1, preferably between 2 and 1.5.

Component according to paragraph 5, wherein the component is characterized in that the ratio of O to N atoms (O/N) in the functional layer is between 0.2 and 1.5, preferably between 0.4 and 1.

Component according to paragraph 5, wherein the component is characterized in that the functional layer has an indentation hardness of at least 25 GPa, preferably greater than 30 GPa.

Component according to paragraph 5, wherein the component is characterized in that the functional layer has a modulus of elasticity of at least 280 GPa, preferably greater than 300 GPa.

Component according to paragraph 5, wherein the component is characterized in that, in addition to the cubic CrN and cubic AlN peaks in X-ray diffraction, the functional layer also has additional peaks of at least one oxide.

Component according to paragraph 11, wherein the component is characterized in that at least one of the additional peaks is the peak of a hexagonal phase (such as eskolaite and/or corundum).

A method for producing a component or a coating according to paragraph 1, wherein the method is characterized in that cathodic spark evaporation and/or a sputtering method is used for its production.

Method according to paragraph 13, wherein the surface to be coated is a high-chrome steel surface and/or a Ni—Cr, Ni—Co, Ni—Cr—Co containing substrate surface and/or a substrate surface containing one or more super alloys, preferably an aluminide containing (Al—Ni, Al—Ti, Al—Hf) substrate surface.

The invention claimed is:

1. A component of a gas turbine, wherein the component has a coating for increasing erosion and corrosion resistance, wherein the coating is applied directly to the component, and the coating consists of a functional layer and an intermediate layer, wherein the intermediate layer is arranged between the turbine blade substrate and the functional layer, the functional layer consists of the elements Al, Cr, O and N, and the intermediate layer comprises a layer system made of a single layer of Cr, a single layer of AlCr, and a single layer of Al—Cr—O in this order.

2. The component according to claim 1, wherein the functional layer is a monolayer or a multilayer.

3. The component according claim 2 wherein the functional layer comprises a multilayer structure in which an Al/Cr ratio, an O/N ratio, or a combined Al/Cr and O/N ratio changes periodically over at least part of a layer thickness, aperiodically over at least part of the layer thickness, or both periodically and aperiodically over at least part of the layer thickness.

4. The component according to claim 3 wherein the ratio of Al to Cr (Al/Cr) atoms in the functional layer is between 4 and 1.

5. The component according to claim 3 wherein the ratio of O to N atoms (O/N) in the functional layer is between 0.2 and 1.5.

6. The component according to claim 3 wherein the functional layer has an indentation hardness of at least 25 GPa.

7. The component according to claim 3 wherein the functional layer has a modulus of elasticity of at least 280 GPa.

8. The component according to claim 3 wherein, in addition to cubic CrN and cubic AlN peaks in X-ray diffraction, the functional layer also has additional peaks of at least one oxide.

9. The component according to claim 8 wherein at least one of the additional peaks is a peak of a hexagonal phase.

10. A method for producing the component according to claim 1 comprising using cathodic spark evaporation, a sputtering method, or both cathodic spark evaporation and a sputtering method for its production and first depositing the intermediate layer that includes a single layer of Cr, a single layer of AlCr, and a single layer of Al—Cr—O in this order, directly on a cleaned surface of the component and depositing the functional layer consisting of the elements Al, Cr, O and N directly thereafter.

11. The method according to claim 10, wherein the surface to be coated is selected from the group consisting of a high-chrome steel surface, a Ni—Cr-containing surface, a Ni—Co-containing surface, a Ni—Cr—Co-containing surface, a surface containing one or more super alloys, an aluminide-containing surface, and combinations thereof.

\* \* \* \* \*